United States Patent [19]
Takada

[11] Patent Number: 5,216,276
[45] Date of Patent: Jun. 1, 1993

[54] SEMICONDUCTOR INTEGRATED CIRCUIT DEVICE HAVING HIGH MATCHING DEGREE AND HIGH INTEGRATION DENSITY

[75] Inventor: Hideki Takada, Yokohama, Japan

[73] Assignee: Kabushiki Kaisha Toshiba, Kawasaki, Japan

[21] Appl. No.: 622,592

[22] Filed: Dec. 5, 1990

[30] Foreign Application Priority Data

Dec. 8, 1989 [JP] Japan .................................. 1-317861

[51] Int. Cl.[5] ..................... H01L 27/82; H01L 29/00; H01L 23/48; H01L 23/52
[52] U.S. Cl. ..................... 257/588; 257/518; 257/754; 257/763; 257/768; 341/159
[58] Field of Search ..................... 357/34, 43, 45, 71; 257/518, 588, 754, 763, 768; 341/159

[56] References Cited

U.S. PATENT DOCUMENTS

| | | | |
|---|---|---|---|
| 3,868,722 | 2/1975 | Le Can et al. | 357/34 |
| 3,981,072 | 9/1976 | Buie | 357/34 |
| 4,110,782 | 8/1978 | Nelson et al. | 357/34 |
| 4,360,823 | 11/1982 | van Gils | 357/34 |
| 4,826,780 | 5/1989 | Takemoto et al. | 357/34 |
| 4,939,518 | 7/1990 | Hotta et al. | 341/159 |
| 4,946,798 | 8/1990 | Kawakatsu | 357/34 |
| 4,980,738 | 12/1990 | Welch et al. | 357/34 |

FOREIGN PATENT DOCUMENTS

| | | | |
|---|---|---|---|
| 2708639 | 8/1978 | Fed. Rep. of Germany | 357/34 |
| 52-6092 | 1/1977 | Japan | 357/34 |
| 55-22900 | 2/1980 | Japan | 357/34 |
| 1-9657 | 1/1989 | Japan | 357/34 |
| 1-198072 | 8/1989 | Japan | 357/34 |

*Primary Examiner*—Rolf Hille
*Assistant Examiner*—Steven Loke
*Attorney, Agent, or Firm*—Finnegan, Henderson, Farabow, Garrett & Dunner

[57] ABSTRACT

A semiconductor integrated circuit device includes at least two bipolar transistors having a first type structure in which a wiring layer is formed in direct contact with the emitter region thereof and at least one bipolar transistor having a second type structure in which a polysilicon layer is formed on the emitter region thereof. The transistor having the first type structure is used in a circuit which is required to have a high matching degree. The transistor having the second type structure is used in a circuit which is required to have a high performance, low power consumption and high integration density rather than a high matching degree.

13 Claims, 6 Drawing Sheets

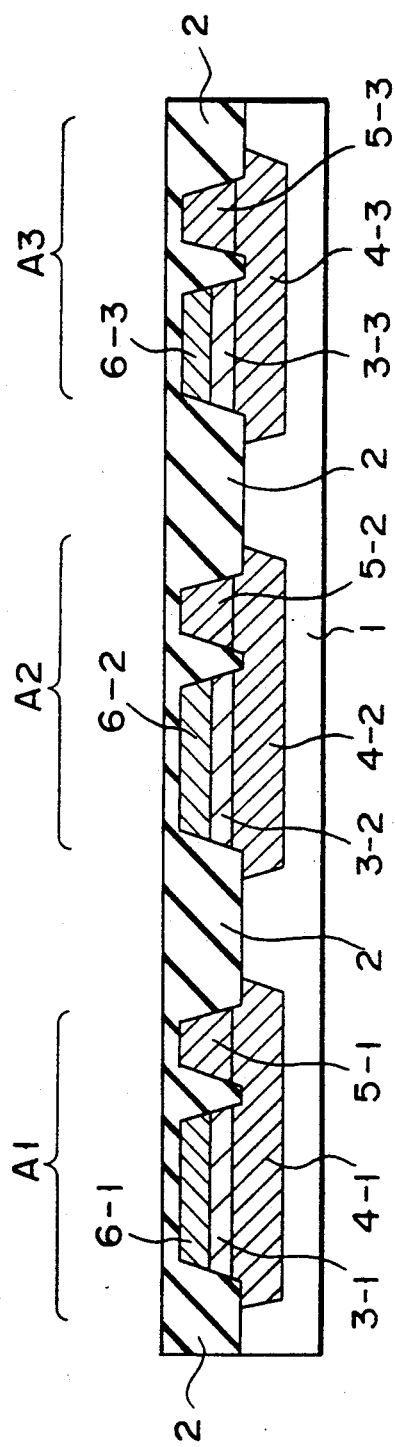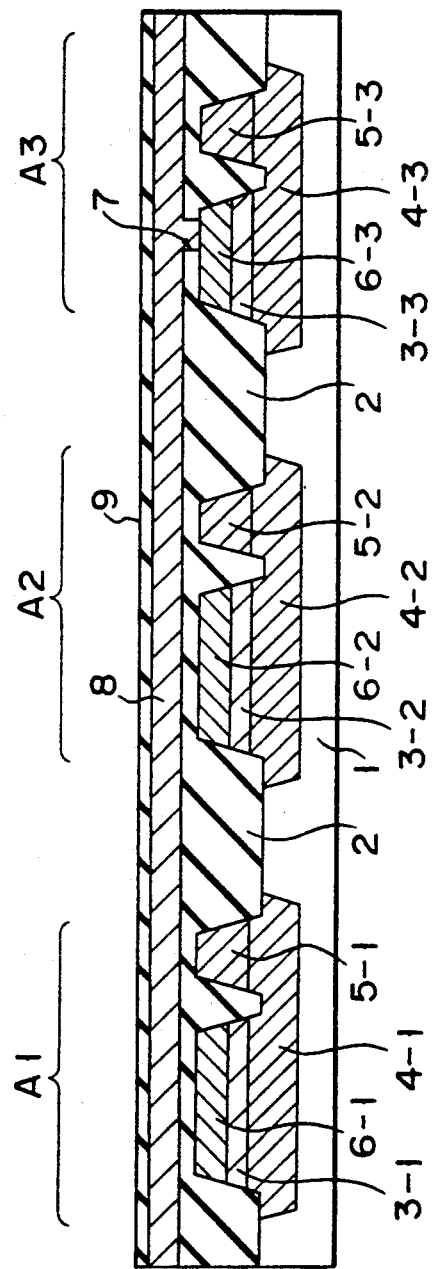

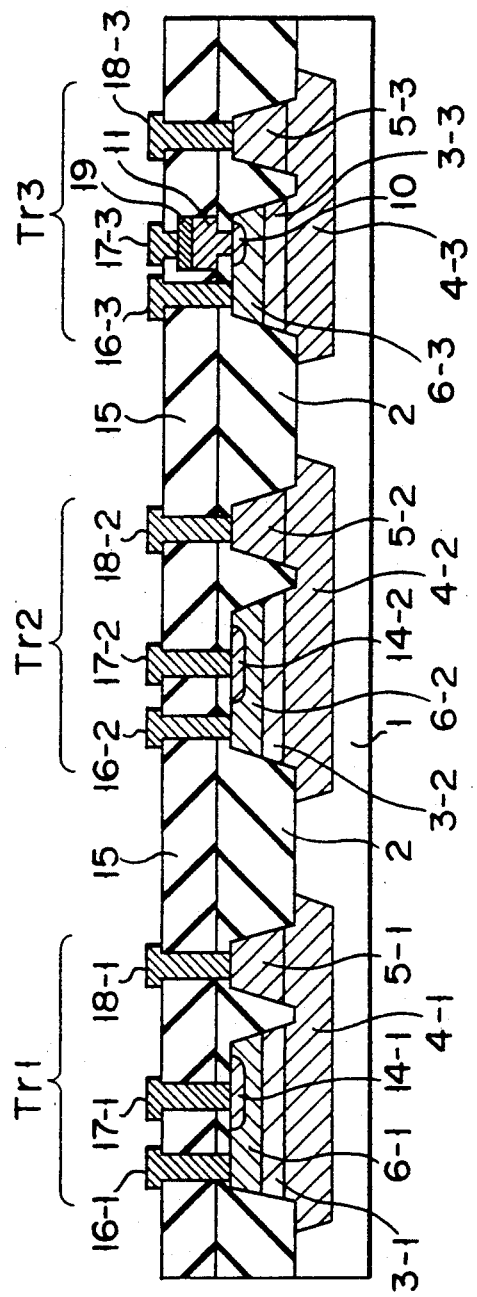
F I G. 4
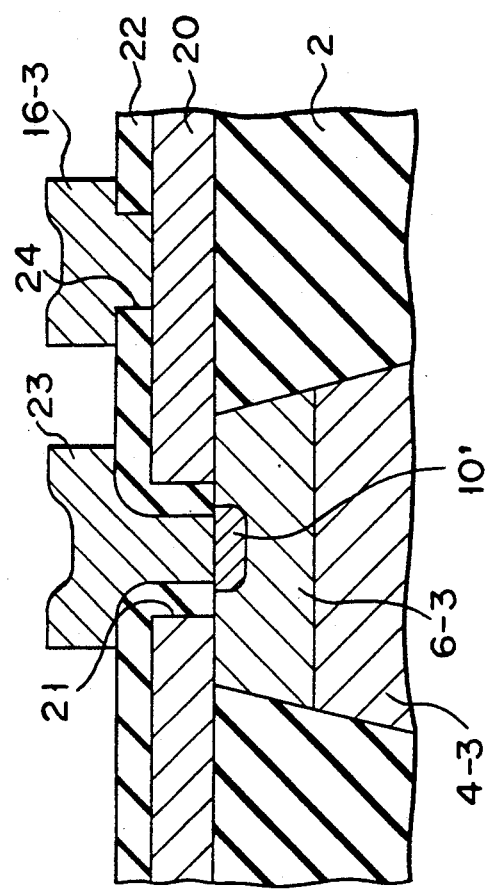
F I G. 5

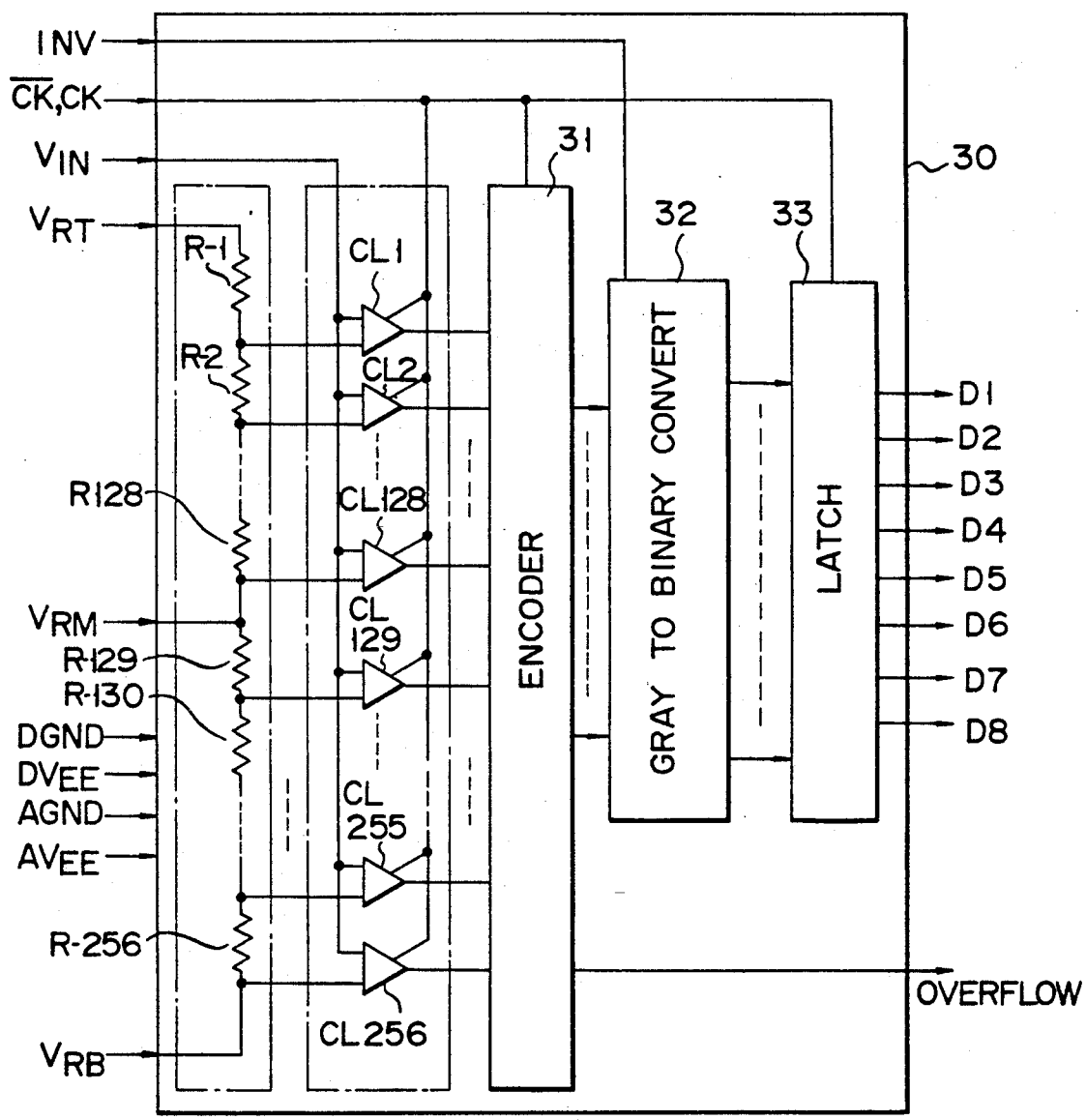
F I G. 6

SEMICONDUCTOR INTEGRATED CIRCUIT DEVICE HAVING HIGH MATCHING DEGREE AND HIGH INTEGRATION DENSITY

BACKGROUND OF THE INVENTION

1. Field of the Invention

This invention relates to a semiconductor device, and more particularly to a semiconductor integrated circuit device having a circuit formed of bipolar transistors therein.

2. Description of the Related Art

Recently, bipolar transistors whose emitter electrodes are formed of polysilicon in order to attain low power consumption high integration density and high performance have been used in a semiconductor integrated circuit device having a circuit formed of bipolar transistors. It is known that the base current of the bipolar transistor having an emitter electrode formed of polysilicon is small, and, therefore, the base Gummel number can be made large and a smaller base resistance can be obtained. As a result, particularly, the switching characteristic of the bipolar transistor can be enhanced. Further, since the emitter electrode is led out to the exterior via a polysilicon layer, it becomes possible to form a bipolar transistor having an area smaller than that of a bipolar transistor having the minimum area determined by the limitation of the photolithography including the mask alignment margin for formation of a metal layer for wirings.

However, the bipolar transistor having the emitter electrode formed of polysilicon has a defect that the characteristic of each transistor may tend to significantly vary. For example, assuming that two bipolar transistors of the above type are used as differential input transistors of differential amplifier to constitute a circuit, then a difference between the base-emitter voltages $V_{BE}$ of the two bipolar transistors becomes excessively large, deteriorating the reliability of the differential amplifier. That is, when a circuit has bipolar transistors used in a paired form, and the emitters or collectors thereof are connected to each other, the matching degree is lowered because of possible difference between the base emitter voltage $V_{BE}$.

If variation in the base-emitter voltage VBE of the bipolar transistor having the emitter electrode formed of polysilicon is made small i order to enhance the matching degree, it becomes necessary to increase the emitter area. As a result, the area of the bipolar transistor becomes larger than that of a bipolar transistor in which the emitter electrode is not formed of polysilicon.

SUMMARY OF THE INVENTION

Accordingly, an object of this invention is to provide a semiconductor integrated circuit device in which bipolar transistors having a high matching degree and a bipolar transistor having a high performance and low power consumption are integrated in a small occupied area.

The above object can be attained by a semiconductor integrated circuit device comprising a semiconductor body of a first conductivity type; first and second bipolar transistors formed in the main surface area of the semiconductor body and each having a collector region, base region and emitter region; a first wiring layer formed in direct contact with the emitter regions of the first and second bipolar transistors; a third bipolar transistor formed in the main surface area of the semiconductor body and having a collector region, base region and emitter region; and a polysilicon layer formed in contact with the emitter region of the third bipolar transistor.

The first and second bipolar transistors are used to form a circuit which requires a high matching degree. For example, they are used as input stage transistors of a differential amplifier. The third bipolar transistor is used to constitute a circuit which does not particularly require a high matching degree.

As described above, a semiconductor integrated circuit device in which bipolar transistors having a high matching degree and a bipolar transistor having a high performance and low power consumption are integrated in a small occupied area can be provided by selectively using the two different types of bipolar transistors in a single chip according to the required characteristic.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are cross sectional views showing a manufacturing process in the order of the steps for manufacturing a semiconductor integrated circuit device according to one embodiment of this invention;

FIG. 4 is a cross sectional view for illustrating a second embodiment of this invention;

FIG. 5 is a cross sectional view showing an enlarged portion of a bipolar transistor, for illustrating a third embodiment of this invention;

FIG. 6 is a block diagram showing a schematic construction of an A/D converter constituted by using the bipolar transistor structure shown in FIG. 1D.

DETAILED DESCRIPTION OF THE PREFERRED EMBODIMENTS

Figure 1C:
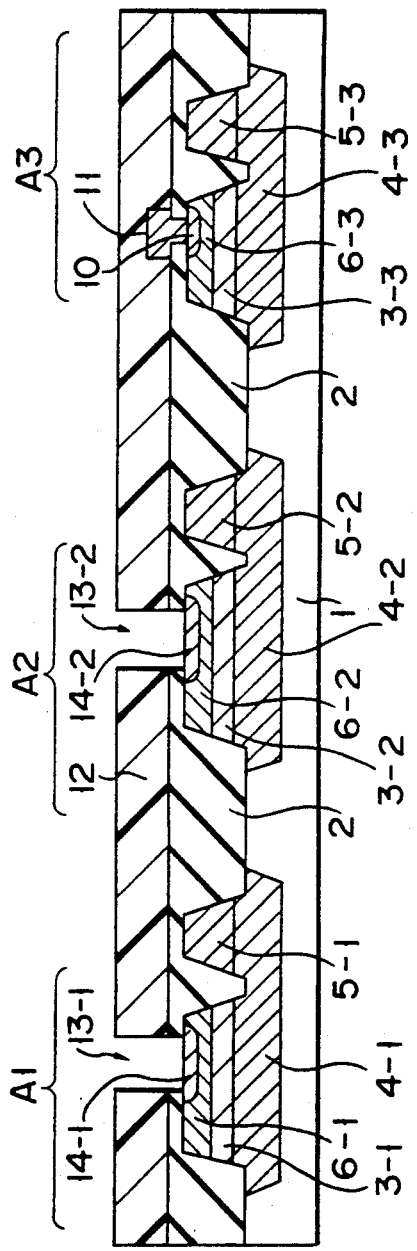

There will now be described a first embodiment of this invention with reference to FIGS. 1A to 1D in an order of the manufacturing steps.

First, as shown in FIG. 1A, at least three bipolar transistor forming regions A1, A2 and A3 which are separated from each other by an insulation film 2 and in which bipolar transistors Tr1, Tr2 and Tr3 will be respectively formed are formed in a semiconductor substrate 1 by using a manufacturing method which is well known in the art. The regions A1 and A2 are bipolar transistor forming regions for the bipolar transistors Tr1 and Tr2 in which wiring layers are formed in direct contact with the emitter regions thereof. The region A3 is a bipolar transistor forming region for the bipolar transistor Tr3 in which a polysilicon layer is formed on the emitter region thereof. The areas of the regions A1, A2 and A3 are set to have the following relation, for example.

$$\text{Area of region } A1 = \text{Area of region } A2 \quad (1)$$

$$\text{Area of region } A3 < \text{Area of region } A1 \text{ or } A2 \quad (2)$$

This relation is set for an integrated circuit of minimum unit, and the relation (1) may be variously modified according to the types of circuits to be constituted, for example. However, in a case wherein at least two bipolar transistors are used in a paired form to constitute the input stage of a differential amplifier, it is preferable to set the areas of the above regions in the respective bipolar transistors equal to each other.

Further, it is preferable to maintain the relation (2) from the viewpoint of high integration density, but since the high integration density is basically required in any integrated circuit, the relation may be set within a design limitation or under a condition that the integration density of devices is higher than that of the conventional devices.

$n^+$-type collector buried layers 4 (4-1, to 4-3) are formed in the regions A1, A2 and A3 of the substrate 1 and n-type collector regions 3 (3-1 to 3-3) are formed in portions of the buried layers 4. $n^+$-type collector lead-out regions 5 (5-1 to 5-3) are formed separately from the collector regions 3 in different portions of the collector buried layers 4. p-type base regions 6 (6-1 to 6-3) are formed in the collector regions 3, respectively. The impurity concentration and depth of the base regions 6-1 and 6-2 may be set different from that of the base region 6-3.

Next, as shown in FIG. 1B, only that part of the insulation film 2 which lies on the base region 6-3 in the region A3 and corresponds to the emitter forming area is selectively removed by use of the photolithographic process to form an opening 7. As a result, the surface of part of the p-type base region 6-3 is exposed. Then, a polysilicon layer 8 is formed on the resultant structure by use of the CVD method, for example. Arsenic is ion-implanted into the polysilicon layer 8. Then, a CVD silicon oxide film 9 is formed on the polysilicon layer 8 by the CVD method, for example.

Next, a heat treatment is effected at temperatures of 900° to 950° C., for example, to cause the arsenic to be diffused from the polysilicon layer 8 into the surface area of the base region 6-3 via the opening 7. Thus, an $n^+$-type emitter region 10 is formed as shown in FIG. 1C. Next, after the silicon oxide film 9 is peeled off, the polysilicon layer 8 is patterned by use of the photolithographic process to form an emitter electrode 11. Then, a photoresist 12 is formed by coating on the resultant structure and openings 13-1 and 13-2 are formed int eh insulation film 2 in positions corresponding to the emitter forming areas of the regions A1 and A2 by the photolithographic process. Arsenic is ion-implanted into the surface areas of the p-type base regions 6-1 and 6-2 via the openings 13-1 and 13-2 to form $n^+$-type emitter regions 14-1 and 14-2.

Figure 1D:
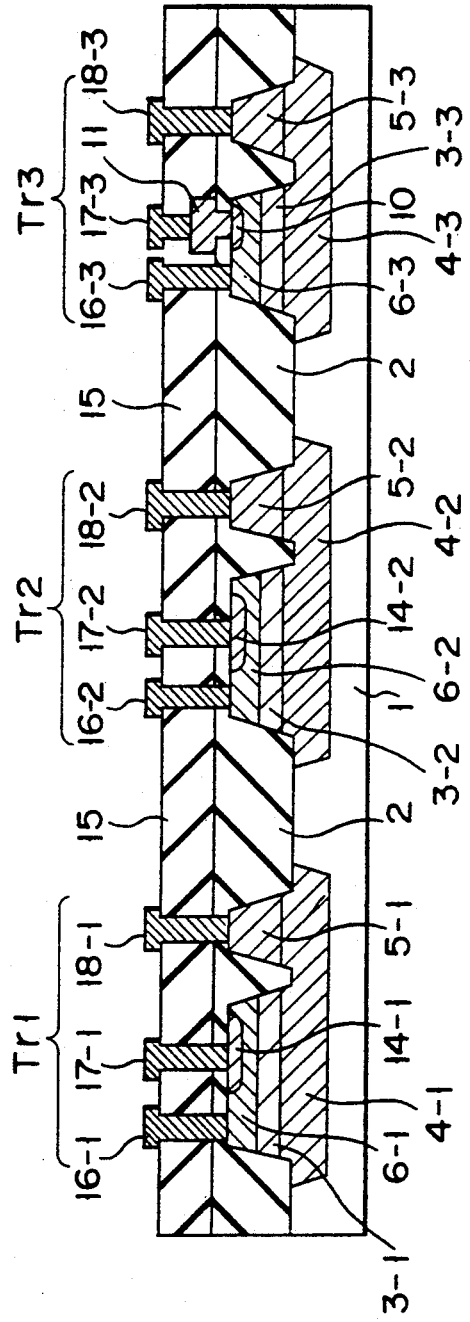

After the photoresist 12 is peeled off, a CVD silicon oxide film 15 is formed by deposition as shown in FIG. 1D. After a predetermined heat treatment is effected, a silicon nitride film (not shown) is formed by the CVD method. Contact holes are formed in the insulation film 2 and oxide film 15 on or above the base regions, emitter regions and collector regions of the bipolar transistors Tr1, Tr2 and Tr3 by the photolithographic process. A metal layer for wiring is formed by vapor deposition on the oxide film 15 by use of the sputtering method and the metal layer 15 is patterned into a preset wiring pattern (base wirings 16-1 to 16-3, emitter wirings 17-1 to 17-3, collector wiring 18-1 to 18-3).

The semiconductor integrated circuit device thus constituted has at least three bipolar transistors Tr1, Tr2 and Tr3 which have two different types of structures as shown in FIG. 1D. The transistors Tr1 and Tr2 among the three bipolar transistors Tr1, Tr2 and Tr3 have the emitter regions 14-1 and 14-2 formed in direct contact with the respective emitter wirings 17-1 and 17-2. On the other hand, the transistor Tr3 has the emitter electrode 11 formed of polysilicon and disposed between the emitter wiring 17-3 and the emitter region 10.

Since variation in the characteristic, for example, the base-emitter voltage VBE of the bipolar transistors Tr1 and Tr2 is small, the transistors can be suitably used in a circuit which constitutes a comparator or differential amplifier using the bipolar transistors in a paired form. In contrast, since the bipolar transistor Tr3 has an excellent switching performance, low power consumption, high integration density and the like, it is formed in a circuit portion other than the above circuit.

As described above, bipolar transistors having an excellent matching degree and bipolar transistors having a high performance and low power consumption can be integrated in a small occupied area by separating the two types of bipolar transistors according to the application thereof and arranging them in suitable portions.

Figure 2:
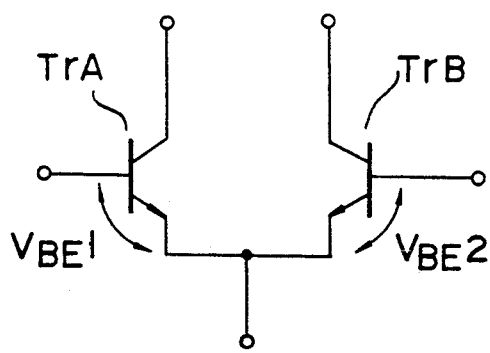
FIG. 2 is a circuit diagram showing a main portion of a circuit used for experiments effected to confirm the effect of this invention.

In order to confirm the effect of this invention, the inventor of this application made experiments on the degree of matching between a bipolar transistor having an emitter electrode formed of polysilicon and a bipolar transistor whose emitter electrode is not formed of polysilicon. The result of the experiments is explained with reference to FIGS. 2 and 3 below. FIG. 2 is a circuit diagram showing the main portion of a circuit used for the experiments. The circuit is constituted by two bipolar transistors TrA and TrB having emitters connected together. Assuming that the base-emitter voltages of the bipolar transistors TrA and TrB are respectively $V_{BE}1$ and $V_{BE}2$ and the absolute value of a difference between the voltages is $\Delta V_{BE}$, then the following equation can be obtained.

$$\Delta V_{BE} = |V_{BE}1 - V_{BE}2|$$

Figure 3:
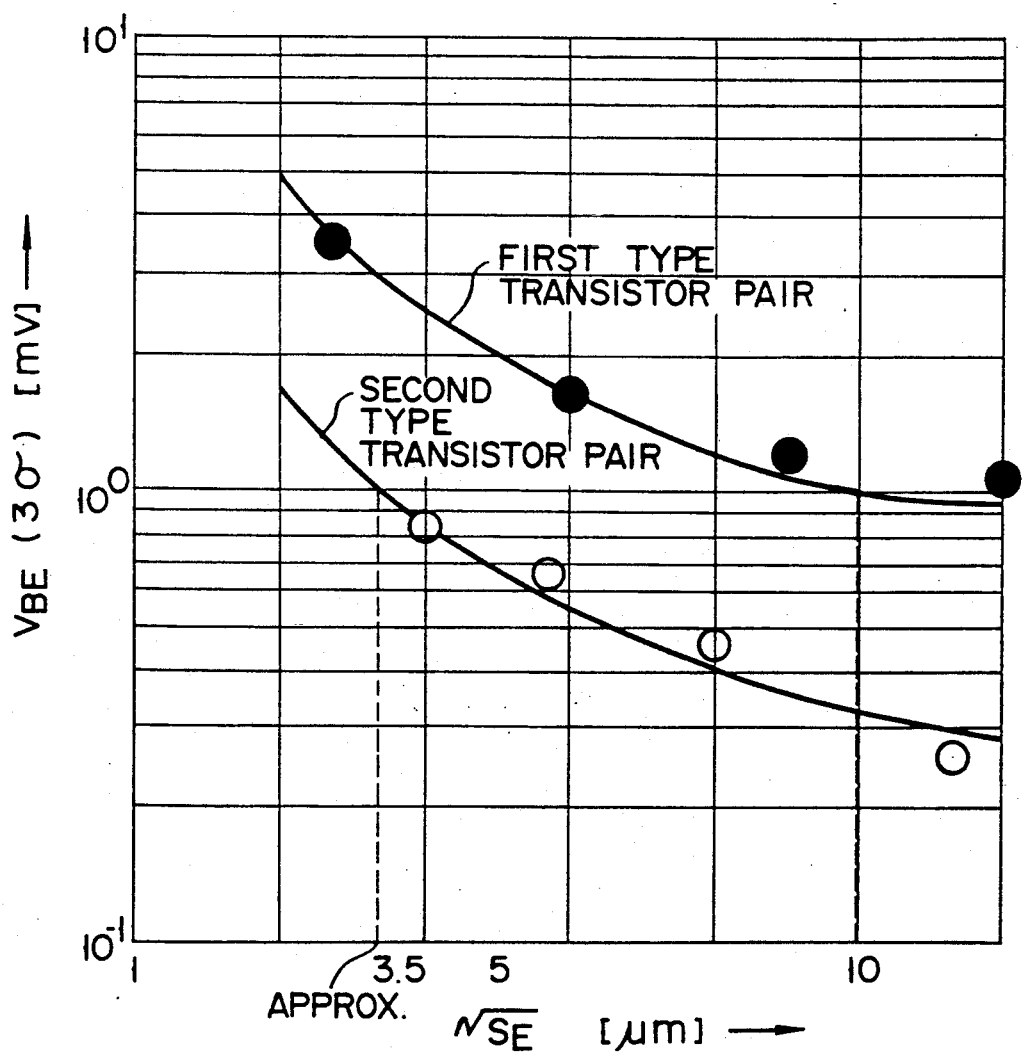
FIG. 3 is a diagram showing the relation between variation in the absolute value of a difference obtained by subtracting a base-emitter voltage of a second bipolar transistor from a base-emitter voltage of a first bipolar transistor in the circuit of FIG. 2 and an area of the emitter region, for illustrating the result of the experiments.

Variation in $\Delta V_{BE}$ was checked in a case where the circuit shown in FIG. 2 was constituted by a pair of bipolar transistors each having an emitter electrode formed of polysilicon (first type transistor pair) and in a case where the circuit was constituted by a pair of bipolar transistors each of which did not use polysilicon (second type transistor pair). Then, the result as shown by the graph in FIG. 3 was obtained. In FIG. 3, the relation between variation in $\Delta V_{BE}$ and the area $S_E$ of the emitter is shown. The ordinate indicates variation in $\Delta V_{BE}$ and the abscissa indicates the square root of the area $S_E$ of the emitter.

As shown in FIG. 3, if $\Delta V_{BE}$ is set to approx. 1 mV or less, then an area of approx. 10 μm × approx. 10 μm = approx. 100 μm² must be provided as the area of the emitter $S_E$ in the case of the first type transistor pair.

However, in the case of the second type transistor pair, an area of approx. 3.5 μm × approx. 3.5 μm = approx. 12.25 μm² is sufficient as the area $S_E$ of the emitter and thus the area of the emitter is reduced to ⅛ times.

It is clearly understood from the result of the experiments that the circuit can be formed in a smaller area by using the second type transistor pair than by using the first transistor pair when the circuit is formed of bipolar transistors to have a high matching degree. Therefore, it is understood that bipolar transistors having a high matching degree and bipolar transistors having a high performance and low power consumption can be formed in a small occupied area by using the second type bipolar transistors (corresponding to the transistors Tr1 and Tr2 in FIG. 1D) in a circuit section, which requires a high matching degree and using the first type bipolar transistors (corresponding to the transistor Tr3 in FIG. 1D) in a circuit section other than the above circuit section as described in the above embodiment.

In the embodiment shown in FIGS. 1A to 1D, the emitter wiring 17-3 is used as the emitter lead-out wiring of the transistor Tr3, but it is also possible to use the emitter electrode (polysilicon layer) 11 as the emitter wiring without using the emitter wiring 17-3. Further, the polysilicon layer 11 is disposed between the emitter region 10 and the emitter wiring 17-3, but the same effect as that obtained in the above embodiment can be attained by disposing the polysilicon layer 11 and a refractory metal layer 19 as shown in FIG. 4, that is, by disposing a polycide layer between the emitter region 10 and the emitter wiring 17-3. Alternatively, the polycide layer may be used as the emitter wiring.

A method of forming the emitter region 10 of the transistor Tr3 is not limited to that described in the above embodiment. For example, it can be formed as shown in FIG. 5. FIG. 5 shows an example of another construction of the transistor Tr3 and is an enlarged view of the base region, emitter region and a portion near them. The structure shown in FIG. 1A is obtained in the same manner as described in the first embodiment. Then, an insulation film 2 is etched back to expose the surface of a base region 6-3. A first-level polysilicon layer 20 is formed on the entire surface of the resultant structure. Then, an opening 21 is formed in an emitter region forming area of the polysilicon layer 20 at the maximum precision determined by the limitation of the photolithographic process. Next, the surface of the polysilicon layer 20 is subjected to a thermal oxidation process to form a silicon oxide film 22 on the exposed surface of the polysilicon layer 20. A second-level polysilicon layer is formed on the silicon oxide film 22 and patterned to form an emitter electrode 23. Then, a heat treatment is effected to form an emitter region 10' with the emitter electrode 23 used as a diffusion source. After this, an opening 24 for electrically leading out the base region 6-3 is formed in part of the silicon oxide film 22. A base electrode is formed in the opening 24 and on part of the silicon oxide film 22 which lies near the opening 24.

With the construction shown in FIG. 5, an effect that the size of the emitter region 10' can be made smaller than that determined by the maximum precision of the photolithographic process can be attained in addition to the effect obtained in the first embodiment.

FIG. 6 is a block diagram showing a schematic construction of an 8-bit A/D converter using the bipolar transistor structure obtained by the manufacturing process shown in FIGS. 1A to 1D. Series-connected resistors R-1 to R-256, latching comparator circuits CL1 to CL256, encoder 31, gray to binary convert circuit 32, latch circuit 33 and the like are integrated on a chip 30. The chip 30 is supplied with a control signal $\overline{INV}$ for the gray to binary convert circuit 32, clock signals $\overline{CK}$ and CK, an analog input signal $V_{IN}$, reference voltages $V_{RT}$, $V_{RM}$ and $V_{RB}$, power source voltages DGND and $DV_{EE}$ for the digital circuit, power source voltages AGND and $AV_{EE}$ for the analog circuit, and the like. Reference voltages ($V_{REF}$) which are derived by dividing the reference voltages $V_{RT}$, $V_{RM}$ and $V_{RB}$ are supplied to the first input terminals of the respective bits of the latching comparator circuits CL1 to CL256. The second input terminals of the latching comparator circuits CL1 to CL256 are each supplied with the analog input signal $V_{IN}$. Comparison outputs form the latching comparator circuits COL1 to CL256 are supplied to and encoded by an encoder 31. A gray code signal output from the encoder 31 is supplied to a gray to binary convert circuit 32 and converted into binary data. Binary data output from the gray to binary convert circuit 32 is supplied to and latched by a latch circuit 33. The latch circuit 33 outputs 8-bit digital data D1 to D8 in response to the clock signals $\overline{CK}$ and CK.

When the bit number which can be A/D converted has been exceeded, the encoder 31 outputs a signal indicating an overflow.

Figure 7:
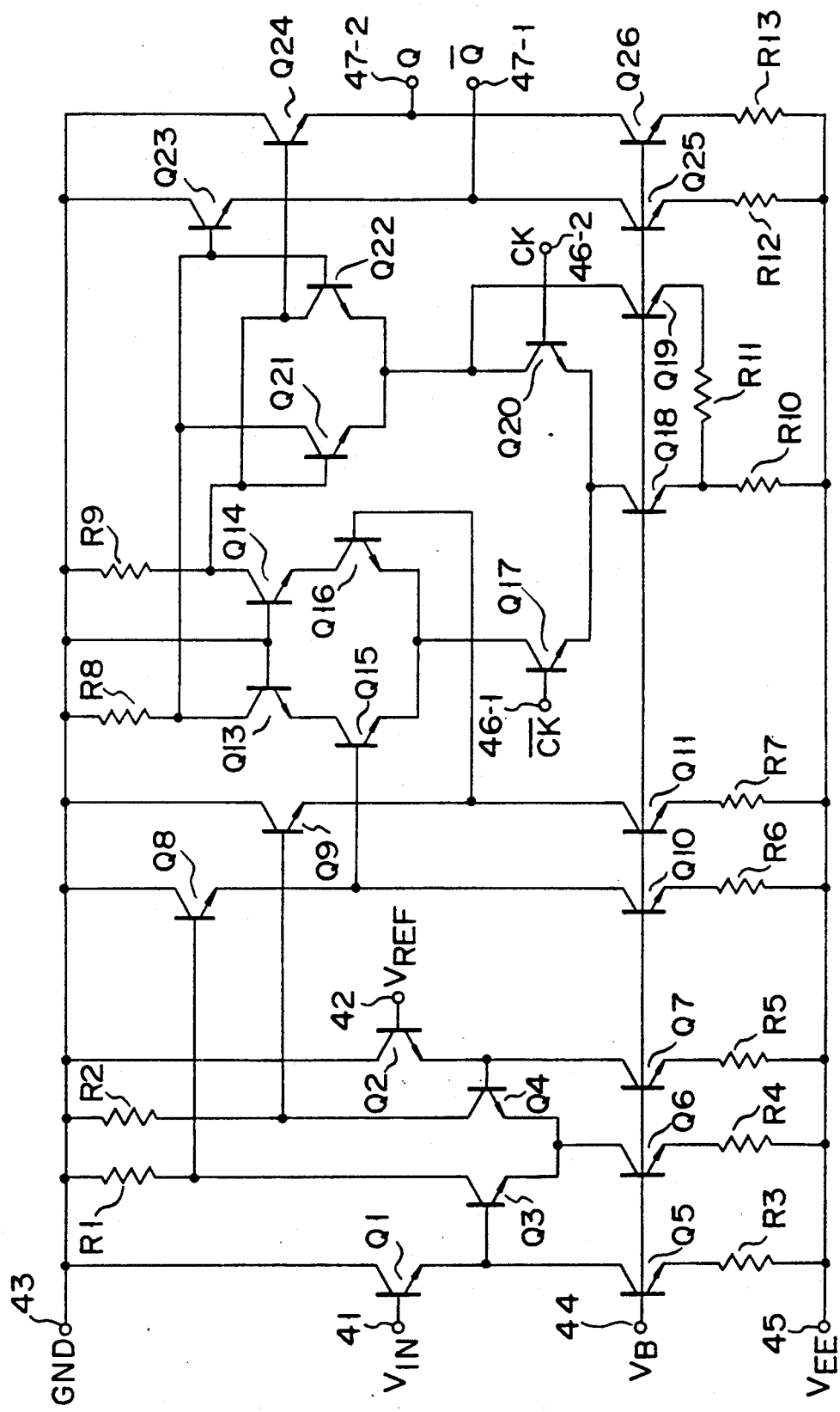
FIG. 7 is a circuit diagram showing an example of the construction of a latching comparator circuit in the circuit shown in FIG. 6.

FIG. 7 is a circuit diagram showing the construction of the latching comparator circuits CL1 to CL256. The circuit includes NPN bipolar transistors Q1 to Q26 and resistors R1 to R13. The bipolar transistors Q1 to Q4 have the same construction as the bipolar transistors Tr1 and Tr2 shown in FIG. 1D, that is, a construction in which the emitter wiring is formed in direct contact with the emitter region. The bipolar transistors Q5 to Q26 have the same construction as that of the transistor Tr3 shown in FIG. 1D, that is, a construction in which an emitter electrode formed of polysilicon is disposed between the emitter region and the emitter wiring.

The base of the transistor Q1 is connected to a first input terminal 41 to which the analog input signal $V_{IN}$ is supplied, and the base of the transistor Q2 is connected to a second input terminal 42 to which the reference voltage $V_{REF}$ is applied. The collectors of the transistors Q1 and Q2 are connected to a power source terminal 43 to which a ground potential GND is applied, and the emitters thereof are respectively connected to the bases of the transistors Q3 and Q4 and to the collectors of the transistors Q5 and Q7. The resistors R1 and R2 are respectively connected between the power source terminal 43 and the collectors of the transistors Q3 and Q4, and the emitters thereof are connected together. The collector of the transistor Q6 is connected to the emitter common connection node of the transistors Q3 and Q4. The bases of the transistors Q5, Q6 and Q7 are connected to a bias terminal 44 to which a bias voltage $V_B$ is applied. The resistor R3, R4 and R5 are respectively connected between the emitters of the transistors Q5, Q6 and Q7 and a power source terminal 45 to which the power source potential $V_{EE}$ is applied. The base of the transistor Q8 is connected to the collector of the transistor Q3, the collector thereof is connected to the power source terminal 43, and the emitter thereof is connected to the collector of the transistor Q10. The base of the transistor Q9 is connected to the collector of the Q4, the collector thereof is connected to the power source terminal 43, and the emitter thereof is connected to the collector of the transistor Q11. The bases of the transistors Q10 and Q11 are connected to the bias terminal 44, and the resistors R6 and R7 are connected between the emitters thereof and the power source terminal 45.

The base of the transistor Q15 is connected to the emitter of the transistor Q8 and the base of the transistor Q16 is connected to the emitter of the transistor Q9. The emitters of the transistors Q15 and Q16 are connected to the collector of the transistor Q17. The collector of the transistor Q15 is connected to the emitter of the transistor Q13, and the collector of the transistor Q16 is connected to the emitter of the transistor Q14. The bases of the transistor Q13 and Q14 are connected to the power source terminal 43 and the resistors R8 and R9 are connected between the power source terminal 43 and the respective collectors of the above transistors.

The base of the transistor Q21 is connected to the collector of the transistor Q14 and the collector thereof is connected to the collector of the transistor Q13. The base of the transistor Q22 is connected to the collector of the transistor Q13 and the collector thereof is connected to the collector of the transistor Q14. The emitters of the transistors Q21 and Q22 are connected together and the emitter common connection node is connected to the collectors of the transistors Q20 and Q19. The base of the transistor Q17 is connected to a clock input terminal 46-1 to which a clock signal $\overline{CK}$ is supplied and the base of the transistor Q20 is connected to a clock input terminal 46-2 to which a clock signal CK is supplied. The emitters of the transistors Q17 and Q20 are connected together and the emitter common connection node is connected to the collector of the transistor Q18. The base of the transistor Q18 is connected to the bias terminal 44 and the resistor R10 is connected between the emitter thereof and the power source terminal 45. The base of the transistor Q19 is connected to the bias terminal 44 and the emitter thereof is connected to one end of the resistor R11. The other end of the resistor R11 is connected to the connection node between the emitter of the transistor Q18 and the resistor R10.

The base, collector and emitter of the transistor Q23 are respectively connected to the collector of the transistor Q13, power source terminal 43 and an output terminal 47-1 from which an output signal $\overline{Q}$ is output. The base, collector and emitter of the transistor Q24 are respectively connected to the collector of the transistor Q14, power source terminal 43 and an output terminal 47-2 from which an output signal Q is output. The emitters of the transistors Q23 and Q24 are respectively connected to the collectors of the transistors Q25 and Q26. The bases of the transistors Q25 and Q26 are connected to the bias terminal 44 and the resistors R12 and R13 are connected between the power source terminal 45 and the emitters of the respective transistors Q25 and Q26.

With the above construction, the transistors Q1 to Q11 and the resistors R1 to R7 constitute a differential amplifier. The transistors Q1 and Q2 are differential input signal transistors which compare an analog input signal $V_{IN}$ and the reference voltage $V_{REF}$ and amplify the difference therebetween. The emitter potentials of the differential input transistors Q1 and Q2 are further amplified by the transistors Q3 and Q4. It is required that the transistors Q1 and Q2 and the transistors Q3 and Q4 have a high matching degree. Therefore, the transistors Q1 to Q4 are formed to have a structure in which an emitter wiring is formed in direct contact with the emitter region. The transistors Q5, Q6, Q7, Q10, Q11 and the resistors R3 to R7 function as a constant current source. The transistors Q8 and Q9 are output transistors of the differential amplifier. Differential outputs derived from the emitters of the output transistors Q8 and Q9 are supplied to a latch circuit constituted by the transistors Q13 to Q26 and the resistors R8 to R13. The operation of the latch circuit is controlled by the clock signals $\overline{CK}$ and CK. The the resistors R8 to R11. Latch outputs of the latch section are output from an output section constituted by the transistors Q23 and Q24 and the resistors R12 and R13. Differential outputs $\overline{Q}$ and Q between the analog input signal $V_{IN}$ and the reference voltage $V_{REF}$ are output from the output terminals 47-1 and 47-2 in synchronism with the clock signals $\overline{CK}$ and CK.

The transistors Q5 to Q26 are not required to have such a high matching degree as the transistors Q1 to Q4. It is preferable that they are formed to have a high performance and low power consumption. Therefore, they are formed to have a structure in which an emitter electrode formed of polysilicon is disposed between the emitter region and the emitter wiring.

As described above, according to this invention, a semiconductor integrated circuit device in which bipolar transistors having a high matching degree and bipolar transistors having a high performance and low power consumption can be integrated in a small area is provided.

What is claimed is:

1. A semiconductor integrated circuit device on a single semiconductor chip operating in response to an analog signal and operating in response to a digital signal, comprising:

a semiconductor substrate of a first conductivity type;

first and second bipolar transistors in a main surface area of said semiconductor substrate, each of said first and second bipolar transistors operating in response to the analog signal, and each of said first and second bipolar transistors having a collector region, a base region and an emitter region;

a first wiring layer in direct contact with the emitter regions of said first and second bipolar transistors;

a third bipolar transistor in the main surface area of said semiconductor substrate, said third bipolar transistor operating in response to the digital signal and said third bipolar transistor having a collector region, a base region and an emitter region; and a polysilicon layer in direct contact with the emitter region of said third bipolar transistor.

2. A device according to claim 1, further comprising a second wiring layer in contact with said polysilicon layer.

3. A device according to claim 1, further comprising a refractory metal layer on said polysilicon layer.

4. A device according to claim 1, wherein said polysilicon layer contains impurity of the second conductivity type.

5. A device according to claim 1, wherein the collector regions of said first and second bipolar transistors each include a collector buried layer of the second conductivity type in the main surface area of said semiconductor substrate; a first impurity diffused region of the second conductivity type formed on a firs region which is part of said collector buried layer and functioning as a collector; and a collector lead-out region of the second conductivity type on a second region which is part of said collector buried layer and is separated from said first region.

6. A device according to claim 5, wherein the base regions of said first and second bipolar transistors are each of a second impurity diffused region of the first conductivity type in the surface area of said collector region.

7. A device according to claim 6, wherein the emitter regions of said first and second bipolar transistors are each of a third impurity diffused region of the second conductivity type in the surface area of said base region.

8. A device according to claim 1, wherein the collector region of said third bipolar transistor includes a collector buried layer of the second conductivity type in the main surface area of said semiconductor body; a first impurity diffused region of the second conductivity type on a first region which is part of said collector buried layer and functioning as a collector; and a collector lead-out region of the second conductivity type on a second region which is part of said collector buried layer and is separated from said first region.

9. A device according to claim 8, wherein the base region of said third bipolar transistor includes a second impurity diffused region of the first conductivity type in the surface area of said collector region.

10. A device according to claim 9, wherein said third bipolar transistor includes a third impurity diffused region of the second conductivity type formed by diffusing impurity from said polysilicon layer into the surface area of said base region.

11. A device according to claim 1, wherein said circuit operating in response to said analog signal includes a differential amplifier and said first and second bipolar transistors are used in the input stage of the differential amplifier.

12. A device according to claim 11, wherein said differential amplifier is used in a latching comparator circuit.

13. A device according to claim 12, wherein said latching comparator circuit is used in an A/D converter.

* * * * *

UNITED STATES PATENT AND TRADEMARK OFFICE
CERTIFICATE OF CORRECTION

PATENT NO. : 5,216,276
DATED : June 01, 1993
INVENTOR(S) : Hideki Takada

It is certified that error appears in the above-indentified patent and that said Letters Patent is hereby corrected as shown below:

Claim 5, column 9, line 9, change "firs" to --first--.

Signed and Sealed this

Nineteenth Day of April, 1994

Attest:

BRUCE LEHMAN

Attesting Officer    Commissioner of Patents and Trademarks